(12) United States Patent
Kikuchi (10) Patent No.: US 8,557,714 B2
(45) Date of Patent: Oct. 15, 2013

(54) ADHESIVENESS OF FLUOROCARBON (CFX) FILM BY DOPING OF AMORPHOUS CARBON

(75) Inventor: Yoshiyuki Kikuchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/380,842

(22) PCT Filed: Jun. 25, 2010

(86) PCT No.: PCT/US2010/001833
§ 371 (c)(1),
(2), (4) Date: Dec. 25, 2011

(87) PCT Pub. No.: WO2010/151337
PCT Pub. Date: Dec. 29, 2010

(65) Prior Publication Data
US 2012/0100725 A1      Apr. 26, 2012

Related U.S. Application Data

(60) Provisional application No. 61/269,687, filed on Jun. 26, 2009.

(51) Int. Cl.
*H01L 21/31* (2006.01)
(52) U.S. Cl.
USPC ... 438/761; 257/77; 257/E23.074; 257/E21.128
(58) Field of Classification Search
None
See application file for complete search history.

(56) References Cited

U.S. PATENT DOCUMENTS

| | | | |
|---|---|---|---|
| 5,427,985 A | 6/1995 | Hammerschmidt et al. | |
| 6,184,572 B1 | 2/2001 | Mountsier et al. | |
| 6,714,833 B2 | 3/2004 | Nakano et al. | |
| 2002/0100420 A1 | 8/2002 | Burger et al. | |
| 2003/0012890 A1 | 1/2003 | Weber et al. | |
| 2003/0127709 A1 | 7/2003 | Lippmann et al. | |
| 2004/0000534 A1 | 1/2004 | Lipinski | |
| 2005/0227500 A1 | 10/2005 | Sugawara et al. | |
| 2005/0255711 A1 | 11/2005 | Sugawara et al. | |
| 2006/0156984 A1 | 7/2006 | Nozawa et al. | |
| 2008/0274370 A1 | 11/2008 | Sugawara et al. | |
| 2009/0011602 A1 | 1/2009 | Nozawa et al. | |
| 2011/0318919 A1* | 12/2011 | Horigome et al. | 438/653 |

FOREIGN PATENT DOCUMENTS

WO       2008038788 A1    4/2008

OTHER PUBLICATIONS

Shirafuji et al. "Plasma enhanced chemical vapor deposition of thermally stable and low-dielectric-constant fluorinated amorphous carbon films using low-global-warming-potential gas C5F8." Thin Solid Films, Oct. 17, 2000, vol. 374, Issue 2, pp. 256-261.

Yi et al. "Low dielectric fluorinated amorphous carbon thin films grown from C6F6 and Ar plasma." Thin Solid Films, Oct. 3, 2000, vol. 374, Issue 1, pp. 103-108.

(Continued)

*Primary Examiner* — Zandra Smith
*Assistant Examiner* — Pamela E Perkins

(57) ABSTRACT

A method of forming an amorphous carbon layer on an insulating layer includes the step of forming an amorphous carbon layer using a plasma reaction process. The amorphous carbon layer is formed in an atmosphere containing a plasma excitation gas, a $C_xH_y$ series gas, a silicon-containing gas, and an oxygen-containing gas.

20 Claims, 7 Drawing Sheets

(56) References Cited

OTHER PUBLICATIONS

Ma et al. "Structural and electronic properties of low dielectric constant fluorinated amorphous carbon films." Applied Physics Letters, Jun. 22, 1998, vol. 72, No. 25, pp. 3353-3355.

United States Patent and Trademark Office, International Search Report and Written Opinion of corresponding PCT Application No. PCT/US10/01833, dated Nov. 18, 2010, 12 pages.

\* cited by examiner

ADHESIVENESS OF FLUOROCARBON (CFX) FILM BY DOPING OF AMORPHOUS CARBON

This application claims priority from U.S. provisional application Ser. No. 61/269,687, filed Jun. 26, 2009, entitled "Technique for Improving Adhesiveness with Fluorocarbon (CFx) Film by Oxygen-containing Doping to Amorphous Carbon (A Small Amount of Silicon Added)", the content of which is incorporated herein by reference in its entirety.

TECHNICAL FIELD

The present invention relates to semiconductor devices and their manufacturing methods. More specifically, it relates to an amorphous carbon (aC) layer forming process for improving the adhesiveness between an interlayer insulating layer, made of fluorocarbon (CFx), and the amorphous carbon (aC) layer.

BACKGROUND OF THE INVENTION

In recent years, multilayer interconnection structures have been employed to achieve a high-speed operation and miniaturization of semiconductor devices. However, these structures have raised the problem of wiring delay due to an increase in the overall wiring resistance and parasitic capacitance of the wiring layers.

The use of low resistance wiring material, e.g., copper (Cu), as the interconnection body reduces the wiring resistance. Also, the use of low permittivity or low-k materials, e.g., fluorocarbon (CFx), for the insulating layer reduces the parasitic capacitance. On the other hand, to prevent copper (Cu) from diffusing into the insulating layer, a barrier layer is provided between the interconnection body and the insulating layer. In order to achieve the high-speed operation of semiconductor devices, it is also highly recommended to lower the parasitic capacitance of the barrier layer by using insulating materials such as amorphous carbon (aC).

When fluorocarbon (CFx) is used as the material for the insulating layer, the fluorine contained in the fluorocarbon (CFx) layer causes fluorination reaction at the interface between the fluorocarbon (CFx) layer and the barrier layer made of amorphous carbon (aC). The fluorination reaction is due to subsequent heat treatment processes performed during the manufacturing of semiconductor devices. Thereby, a gas desorption reaction, e.g., hydrogen fluoride (HF), occurs with the reaction of hydrogen ($H_2$) and fluorine (F). As a result, the amorphous carbon (aC) barrier layer may be peeled-off from the fluorocarbon (CFx) insulating layer or the copper interconnection body due to significant deterioration of their adhesion properties.

To suppress the desorption reaction of hydrogen fluoride (HF), a process for forming an amorphous carbon layer is proposed in Japanese Patent Application Publication No. 2008-141009. In this process the amorphous carbon (aC) layer is doped with a dopant such as silicon (Si). Although the silicon doping of amorphous carbon (aC:Si) layer suppresses the hydrogen fluoride (HF) generation, this process, however, results in generation of silicon tri-fluoride ($SiF_3$), which in turn deteriorates the adhesiveness between the fluorocarbon (CFx) insulating layer and the silicon-doped amorphous carbon (aC:Si) layer. Therefore, the amorphous carbon (aC) layer may be peeled-off from the insulating layer or the interconnection body in the same manner as described previously.

The present invention is proposed in view of the above aforementioned problems. The present invention provides an amorphous carbon (aC) layer forming method to enhance the adhesiveness between an amorphous carbon (aC) layer and a fluorocarbon (CFx) insulting layer while suppressing the fluorination reaction there between.

SUMMARY OF THE INVENTION

In accordance with one aspect of the present invention, there is provided a method for forming an amorphous carbon layer. The method includes the step of forming an amorphous carbon layer using a plasma reaction process. The amorphous carbon layer is formed in an atmosphere containing a plasma excitation gas, a $C_xH_y$ series gas, a silicon-containing gas, and an oxygen-containing gas.

In accordance with a second aspect of the present invention, there is provided a method for manufacturing semiconductor devices having an amorphous carbon layer as a barrier layer. The method includes the steps of forming a fluorocarbon (CFx) layer over a substrate; and forming an amorphous carbon layer on the fluorocarbon (CFx) layer using a plasma reaction process. The amorphous carbon layer is formed in an atmosphere containing a plasma excitation gas, a $C_xH_y$ series gas, a silicon-containing gas, and an oxygen-containing gas.

DETAILED DESCRIPTION OF INVENTION

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

This disclosure relates in general to semiconductor devices and their manufacturing process. More specifically, it relates to a new process for forming an amorphous carbon (aC) layer to improve the adhesiveness between the amorphous carbon (aC) layer and an insulating layer made of fluorocarbon (CFx).

Embodiments of the present invention are directed to a process for forming an amorphous carbon (aC) layer to suppress generation of silicon tri-fluoride ($SiF_3$) and hydrogen fluoride (HF) and further to improve the adhesiveness of amorphous carbon (aC) layer with the fluorocarbon (CFx) insulating layer. This is achieved by adding an oxygen-containing gas into an atmosphere where the silicon-doped amorphous carbon (aC:Si) layer is formed. In this way, a new amorphous carbon layer doped with silicon and oxygen (aC:Si:O2) is deposited on the fluorocarbon (CFx) insulating layer.

By adding the oxygen-containing gas into the film forming atmosphere of silicon-doped amorphous carbon (aC:Si) layer, a dangling bond of silicon (Si) in the silicon-doped-oxygen amorphous carbon (aC:Si:O2) layer is terminated by oxygen. As a result, the generation of silicon tri-fluoride ($SiF_3$) is suppressed; thereby the adhesiveness between the amorphous carbon (aC) layer and the fluorocarbon (CFx) layer is improved.

According to one aspect of the present invention, the silicon-doped-oxygen amorphous carbon (aC:Si:O2) layer formed according to the process of the present invention may function as a barrier layer between the multilayer interconnection structures to improve the adhesiveness. In this embodiment, the silicon-doped-oxygen amorphous carbon (aC:Si:O2) layer is interleaved between the fluorocarbon (CFx) insulating layers of two adjacent, e.g., $n^{th}$ and $(n+1)^{th}$, interconnection wiring structures. This allows for the practical application of fluorocarbon (CFx) insulating layers in semiconductor devices.

According to another embodiment, the amorphous carbon (aC) layer, formed according to the process of the present invention, may include a multilayer structure. The multilayer structure may include a first layer, made of conventional amorphous carbon (aC) layer, formed over a fluorocarbon (CFx) insulating layer, a second layer, made of silicon-doped amorphous carbon (aC:Si) layer, formed over the first layer, and a third layer, made of silicon-doped-oxygen amorphous carbon (aC:Si:O2) layer, formed over the second layer.

A plasma enhanced chemical vapor deposition (PE-CVD) apparatus is used for forming the silicon-doped-oxygen amorphous carbon (aC:Si:O2) layer according to the process of the present invention. The plasma enhanced CVD apparatus is a film forming device for generating plasma using a radial line slot antenna (RLSA). For the purpose of simplicity, hereinafter, the plasma enhanced CVD apparatus is referred to as "plasma film forming device."

Figure 1:
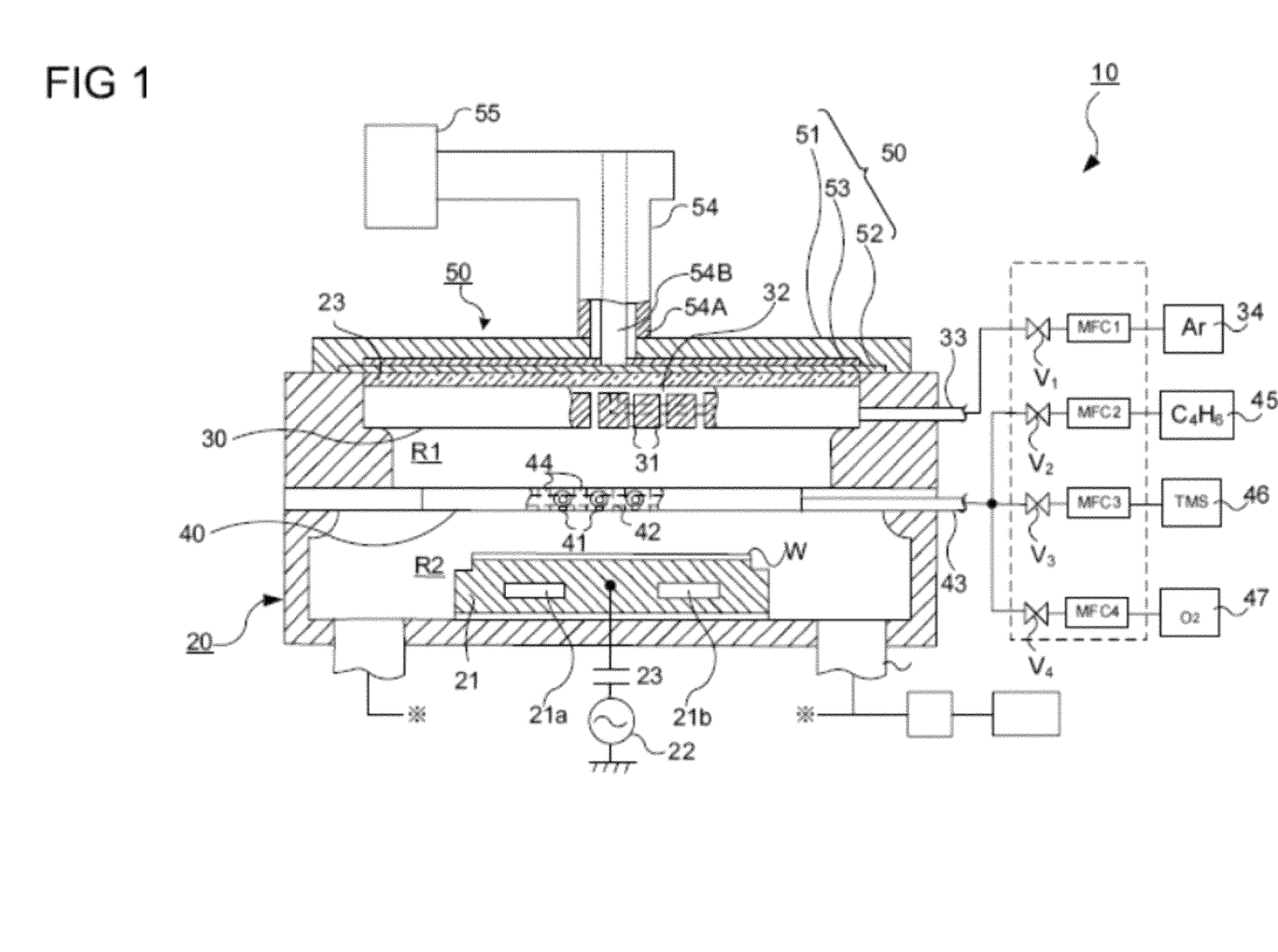
FIG. 1 depicts a schematic diagram of an embodiment of a plasma film forming device.

Referring first to FIG. 1, a schematic diagram of an embodiment of a plasma film forming device 10 is shown. As shown in this figure, the plasma film forming device 10 includes a process vessel 20 (vacuum chamber), an antenna unit 50 (RLSA), and a mounting table 21. Inside of the process vessel 20 is roughly sectionalized into a plasma generation region R1, located below a plasma gas supply unit 30, and a plasma diffusion region R2 at the mounting table 21 side. The plasma generated in the plasma generation region R1 has an electron temperature of several electron volts (eV). When the plasma is diffused into the plasma diffusion region R2, where the film formation process is performed, its electron temperature near the mounting table 21 drops to a value of lower than about 2 eV. The mounting table 21 is located centrally on a bottom portion of the process vessel 20 and serves as a mounting unit for mounting a substrate W. Within the mountain table 21, there is provided an insulating member 21a, a cooling jacket 21b, and a temperature control unit, not shown in this figure, for controlling the substrate temperature.

A top portion of the process vessel 20 is opened-ended. The plasma gas supply unit 30 is placed opposite to the mounting table 21 and is attached to the top portion of the process vessel 20 via sealing members, not shown in this figure, such as O rings. The plasma gas supply unit 30, which may also function as a dielectric window, is made of materials such as, for example, aluminum oxide or quartz and its planar surface, which has a virtual disk shape, faces the mounting table 21. A plurality of gas supply holes 31 are provided opposite to the mounting table 21 on the planar surface of the plasma gas supply unit 30. The plurality of gas supply holes 31 communicate with a plasma gas supply port 33 via a gas flow channel 32. A plasma gas supply source 34 provides plasma gas such as, for example, argon (Ar) gas, krypton (Kr) gas, or other inert gases, into the plasma gas supply port 33. The plasma gas is then uniformly supplied into the plasma generation region R1 via the plurality of gas supply holes 31.

The plasma film forming device 10 further includes a process gas supply unit 40, which is located substantially at the centre of the process vessel 20 between the plasma generation region R1 and the plasma diffusion region R2. The process gas supply unit 40 is made of conducting materials such as, for example, aluminum alloy including magnesium (Mg) or stainless steel. Similar to the plasma gas supply unit 30, a plurality of gas supply holes 41 are provided on a planar surface of the plasma gas supply unit 40. The planar surface of the plasma gas supply unit 40 is positioned opposite to the mounting table 21 and has a virtual disk shape.

Figure 2:
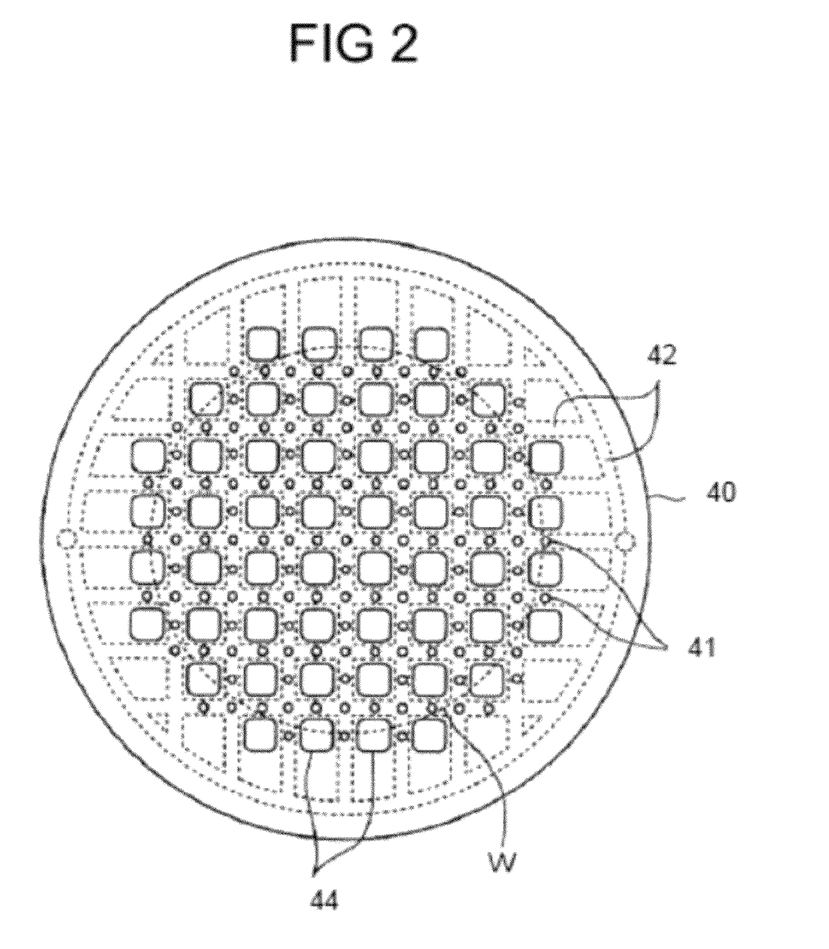
FIG. 2 illustrates a plan view of a gas supplying unit of the plasma film forming device.

A plan view of the process gas supply unit 40 is shown in FIG. 2. As shown in this figure, a grid-like gas flow channel 42, also called shower plate 42, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the mounting table 21. Similar to the previous case, the plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., argon (Ar) gas, krypton (Kr) gas, or other inert gases, into the plasma diffusion region R2 at the mounting table 21 side. As shown in FIG. 2, the plurality of opening 44 is formed between the adjacent gas flow channels 42.

The process gas is supplied, for example, from three separate process gas supply source 45-47 to the process gas supply port 43. The process gas supply sources 45-47 correspond respectively to a $C_xH_y$ series gas, a silicon-containing gas, and an oxygen-containing gas. An example of $C_xH_y$ series process gas may include $C_5H_8$, $C_4H_8$, $C_4H_6$, $CH_4$, $C_2H_2$, $C_2H_4$, $C_2H_6$, $C_3H_8$, and $C_3H_6$. The silicon-containing gas may include silane ($SiH_4$) gas, disilane ($Si_2H_6$) gas, trimethylsilane (TMS) gas, monomethylsilane (MMS) gas, and dimethylsilane (DMS) gas. In the preferred embodiment, oxygen gas ($O_2$) is provided as the process gas supply source 47. In an alternative embodiment, an oxygen-containing gas may be used as the process gas supply source 47. Example of the oxygen-containing gas may include carbon monoxide (CO) or carbon dioxide (CO2) gas.

The $C_xH_y$ series process gas, the silicon-containing process gas, and the oxygen-containing process gas flow through the grid-like gas flow channel 42 and are uniformly supplied into the plasma diffusion region R2 via the plurality of gas supply holes 41. The plasma film forming device 10 further includes four valves ($V_1$-$V_4$) and four flow rate controller (MFC1-MFC4) for respectively controlling a supply of the plasma gas, the $C_xH_y$ series gas, the silicon-containing gas, and the oxygen-containing gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the plasma gas, e.g., argon (Ar) gas, krypton (Kr) gas, or other inert gases, within the process vessel 20.

Figure 3:
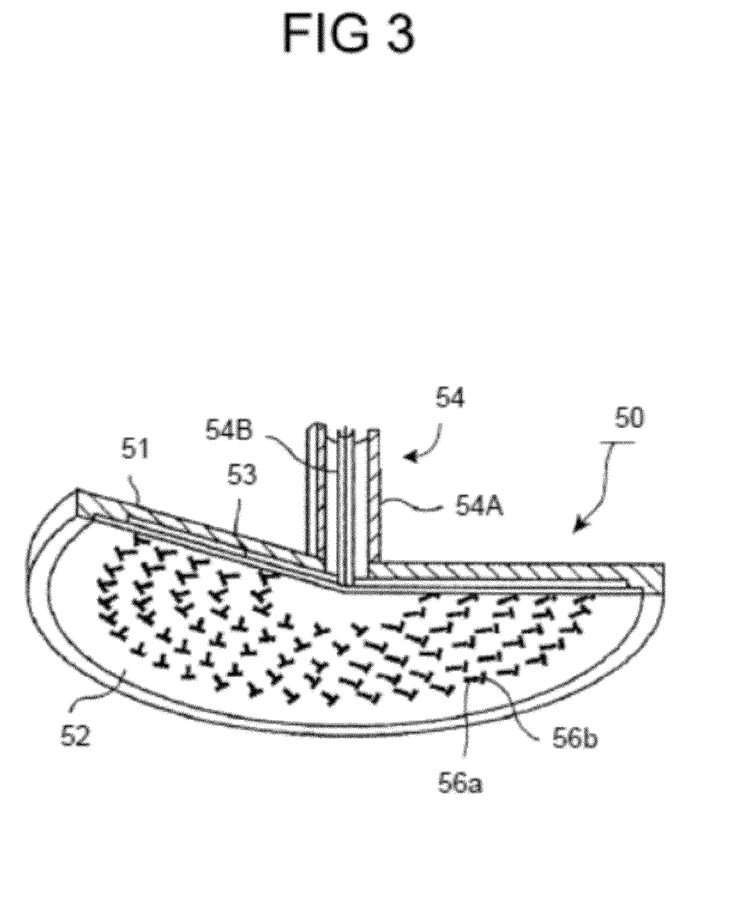
FIG. 3 illustrates a partial cross-sectional view of an antenna portion of the plasma film forming device.

FIG. 3 illustrates a partial cross-sectional view of the antenna unit 50 (RLSA). As shown in this figure, the antenna unit 50 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slot 56 is provided on the radial line slot plate 52 to generate a circular polarized wave. The plurality of slots 56 are arranged in a substantially T-shaped form having a slight gap therebetween, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. As shown in FIG. 1, the radial line slot plate 52 is mounted on the process vessel 20 using sealing members, not shown in FIG. 1, such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the mounting table 21 via an electric power supply source 23. The high-frequency power supply source 22 generates an RF bias power of a predetermined frequency, e.g. 13.56 MHz, for controlling ions energy that are drawn to the substrate W.

The silicon-doped-oxygen amorphous carbon (aC:Si:O2) layer of the present invention is formed using the plasma film forming device 10 under a predetermined setting conditions. The predetermined setting conditions may include a microwave power of about 1000 W to 3000 W with a frequency of 2.45 GHz. Further, inside of the process vessel 20 may be adjusted and maintained to a pressure ranging from 10 mTorr to 100 mTorr. Also, the substrate temperature may be adjustable within 150° C. to 400° C. As for the flow rate of material gas, the flow rate of $C_xH_y$ series gas and silicon-containing gas may be set to a range within 10 sccm to 200 sccm. The flow rate of plasma excitation gas, e.g., argon (Ar) gas, ranges from 100 sccm to 2000 sccm. The flow rate of oxygen-containing gas, e.g. $O_2$, CO, or $CO_2$, is set within a range of 10 sccm to 100 sccm.

During the film forming process of the present invention, the plasma gas, e.g., argon (Ar) gas, is introduced into the process vessel 20 using the plasma gas supply unit 30. On the other hand, the process gases including the $C_xH_y$ series gas, the silicon-containing gas, and the oxygen-containing gas and Ar as a carrier gas may be introduced into the process vessel 20 using the process gas supply unit 40.

Figure 4:
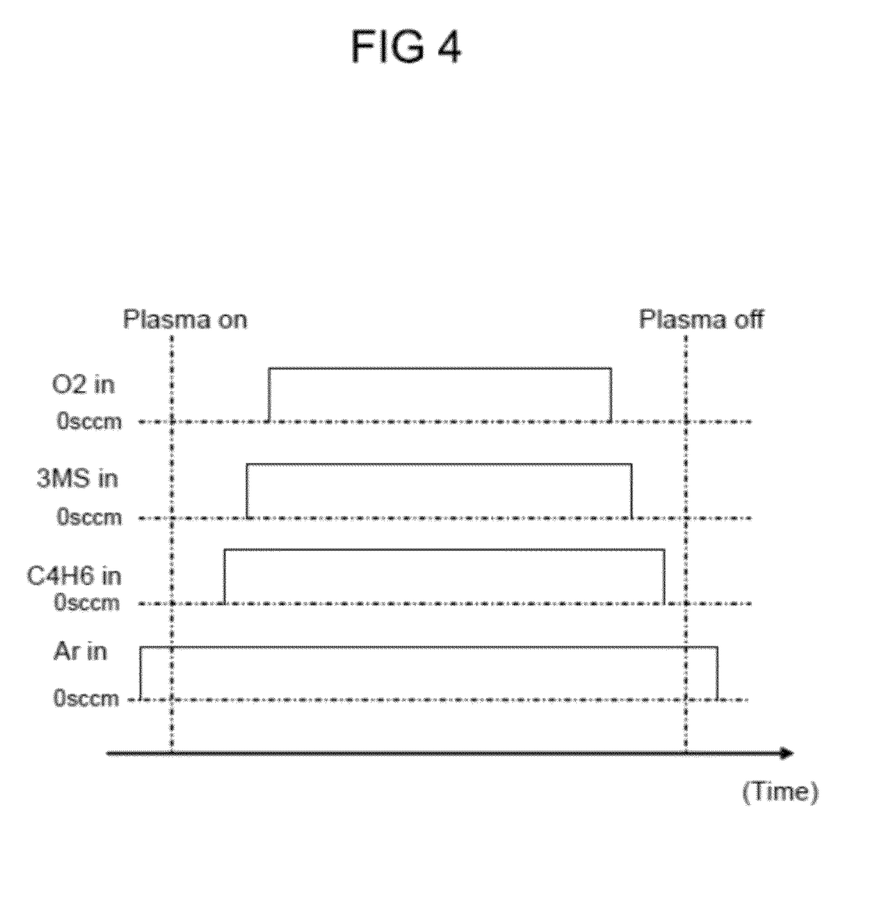
FIG. 4 is a schematic illustration of order and timing introduction of process gases.

With reference to FIG. 4, a schematic illustration of order and timing introduction of plasma and process gases are shown according to the preferred embodiment of the present invention. As shown in this figure, first, a plasma gas such as, for example, argon (Ar) gas is introduced into the process vessel 20 prior to introduction of any process gases. In the next step, the microwave power, form the external microwave generator 55 (please refer to FIG. 1), is turned-on to cause excitation of the plasma gas and thereby to generate the plasma. In this embodiment, the plasma gas introduction occurs prior to turning-on the microwave power. In other embodiments, the plasma gas introduction may occur simultaneously when the microwave power is turned-on.

After the plasma generation step (plasma on), the process gasses are introduced into the process vessel 20. More specifically, the following timing may be used to introduce the following process gases: first, the $C_xH_y$ series gas is introduced in addition to argon (Ar) gas. Second, the silicon-containing gas is introduced in addition to $C_xH_y$ series gas and argon (Ar) gas. Third, the oxygen-containing gas is introduced in addition to $C_xH_y$ series gas, silicon-containing gas, and argon (Ar) gas. It should be noted that the introduction of silicon-containing gas occurs prior to the introduction of oxygen-containing gas.

In the preferred embodiment, the following plasma and process gasses are used in each of the above-mentioned steps to form the amorphous carbon (aC) layer according to the process of present invention: 1) $C_4H_6$+Ar, 2) $C_4H_6$+Ar+3MS, and 3) $C_4H_6$+Ar+3MS+$O_2$. According to this process, the silicon-containing gas is introduced when a conventional amorphous carbon (aC) layer is formed with a thickness of lower than 1 nm. Then, the oxygen-containing gas is introduced when a silicon-doped amorphous carbon layer (aC:Si), with a thickness of lower than 1 nm, is formed over the first layer, which is the conventional amorphous carbon (aC) layer. The introduction of oxygen-containing gas continues until a silicon-doped-oxygen amorphous carbon layer (aC:Si:$O_2$) with a desired thickness is formed. The silicon-doped-oxygen amorphous carbon layer (aC:Si:$O_2$) is formed on the second layer, which is silicon-doped amorphous carbon layer (aC:Si).

In the last step, the plasma is turned-off (plasma off) by turning-off the microwave power from the external microwave generator 55. In this embodiment, the plasma is turned off (plasma off) after inhibiting the oxygen-containing gas introduction. In other embodiments, the turning-off of the microwave power may occur simultaneously with inhibiting the oxygen-containing gas introduction.

The above-mentioned process for introducing plasma and process gasses is used for two main reasons: 1) to prevent damage to the underlying fluorocarbon (CFx) layer, and 2) to suppress the generation of HF and $SiF_3$ during the subsequent heat treatment process. In the following, theses two main reasons will be explained in detail. In order to prevent damage to the underlying fluorocarbon (CFx) layer, the oxygen-containing gas needs to be introduced later than other process gasses. Otherwise, oxygen plasma may damage the fluorocarbon (CFx) layer.

Moreover, the use of above-mentioned gas introduction process for forming the amorphous carbon (aC) layer help to suppress the generation of HF and $SiF_3$ during the subsequent heat treatment process. According to process of the present invention, the final structure has the following two layers; a fluorocarbon (CFx) insulating layer and a new amorphous carbon layer (aC-aC:Si-aC:Si:$O_2$) formed according to the process of the present invention. The new amorphous carbon layer (aC-aC:Si-aC:Si:$O_2$) of the present invention has a multilayer structure with the following layers: 1) a conventional amorphous carbon (aC) layer, 2) a silicon-doped amorphous carbon (aC:Si) layer, and 3) a silicon-doped-oxygen amorphous carbon (aC:Si:$O_2$) layer. This final structure has the following layers: CFx/aC-aC:Si-aC:Si:$O_2$, where the composition of amorphous carbon (aC) layer varies gradually, in a gradation-like pattern, from the fluorocarbon (CFx) layer to the top silicon-doped-oxygen amorphous carbon (aC:Si:$O_2$) layer to suppress the generation of HF and $SiF_3$ during the subsequent heat treatment process.

More specifically, the interface between the conventional amorphous carbon (aC) layer and the silicon-doped amorphous carbon (aC:Si) layer suppresses the hydrogen fluorine (HF) generation, while the interface between the silicon-doped amorphous carbon (aC:Si) layer and the silicon-doped-oxygen amorphous carbon (aC:Si:$O_2$) layer suppresses the generation of silicon tri-fluoride ($SiF_3$). Therefore, the combination of both interfaces and the silicon-doped-oxygen amorphous carbon (aC:Si:$O_2$) layer suppress the generation of HF and $SiF_3$.

Experimental Samples:

In order to evaluate the effect of adding an oxygen-containing gas into the process of forming a silicon-doped amorphous carbon layer and also to evaluate the adhesion properties of the new silicon-doped-oxygen amorphous carbon (aC:Si:O2) layer, several experimental samples are manufactured. The experimental samples are then subjected to different test for evaluating the above-mentioned properties. Unless described otherwise below, the following setting conditions are used to form the following amorphous carbon layers: 1) aC layers; an argon flow rate of 1050 sccm and a $C_4H_6$ flow rate of 44 sccm, 2) aC:Si layers: a trimethylsilane (TMS) flow rate of 15 sccm, an argon flow rate of 1050 sccm, and a $C_4H_6$ flow rate of 44 sccm, 3) aC:Si:$O_2$ layers: a trimethylsilane (TMS) flow rate of 15 sccm, an oxygen gas ($O_2$) flow rate of 100 sccm, an argon gas flow rate of 1050 sccm, and a $C_4H_6$ gas flow rate of 44 sccm. All the experimental samples with different amorphous carbon (aC) layers (aC, aC:Si, and aC:Si:$O_2$) are formed with a microwave power of 2000 W, a pressure of 50 mTorr inside the process vessel 20, and a substrate temperature of 360° C. In what follows, the results of these evaluations will be explained in detail.

In the following, the effect of adding the oxygen gas ($O_2$) into the film forming atmosphere of silicon-doped amorphous carbon (aC:Si) layer is investigated. For this purpose, three experimental samples with different amorphous carbon layers (aC, aC:Si, and aC:Si:$O_2$) are formed. The experimental samples are then subjected to a thermal desorption spectroscopy (TDS) measurements for evaluating the fluorination reaction in each experimental sample.

Figure 5:
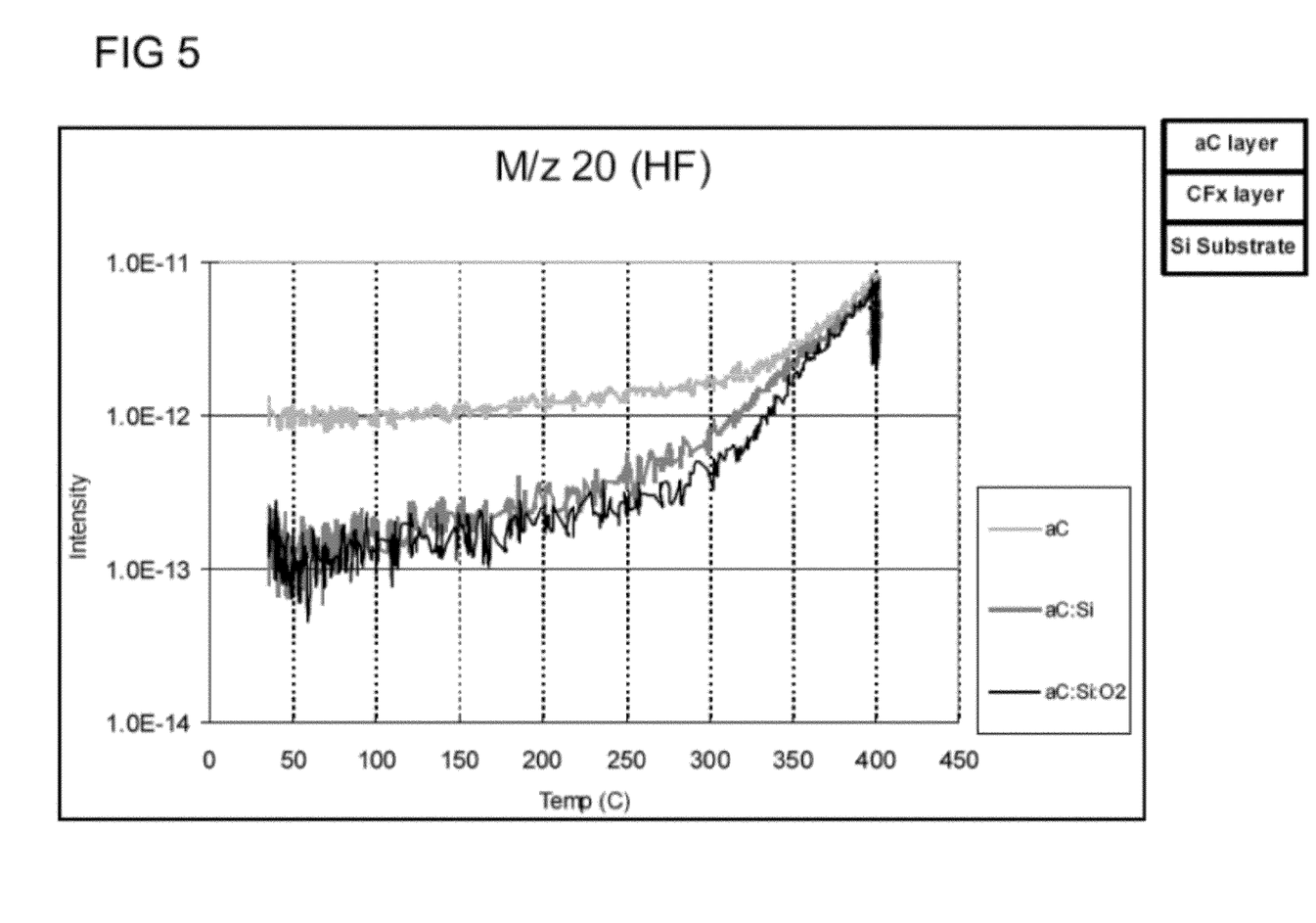
FIG. 5 illustrates target structure and a TDS analysis of HF gas desorption for various experimental samples.

Referring next to FIG. 5, a target structure of experimental samples and their TDS measurement of HF gas desorption is shown as a function of temperature. The structure used for this evaluation includes a substrate, a fluorocarbon (CFx) insulating layer, and an amorphous carbon (aC) layer. In each experimental sample, the amorphous carbon layer is formed on the fluorocarbon (CFx) insulating layer, which is, in turn, formed over the substrate. All three experimental samples are formed using the plasma film forming device 10 with the same setting conditions as those described in paragraph [0038]. The amorphous carbon layer formed in the first, second, and third experimental samples are, respectively, the conventional amorphous carbon layer (aC), the silicon-doped amorphous carbon layer (aC:Si), and the silicon-doped-oxygen amorphous carbon layer (aC:Si:$O_2$).

All three experimental samples are subjected to a TDS analysis for detecting the molecular weight or atomic weight of hydrogen fluoride (HF) desorption gas. The TDS analysis of each experimental sample is also shown in FIG. 5. The vertical axis is the measured-value intensity of hydrogen fluoride (HF) gas at a mass of 20 (M/z=20) and the horizontal axis is the substrate temperature in which the TDS measurement are conducted. In this experiment, the amount of hydrogen fluoride (HF) desorption gas with a mass of 20 is detected at various substrate temperature which ranges from room temperature (~25° C.) to 400° C. A shown in FIG. 5, the experimental sample #3, with silicon-doped-oxygen amorphous carbon layer (aC:Si:$O_2$), shows the lowest amount of hydrogen fluoride (HF) desorption gas. According to these results, the fluorination reaction with regards to the generation of hydrogen fluoride (HF) can be suppressed even further by doping oxygen ($O_2$) into the silicon-doped amorphous carbon layer (aC:Si:$O_2$).

Figure 6:
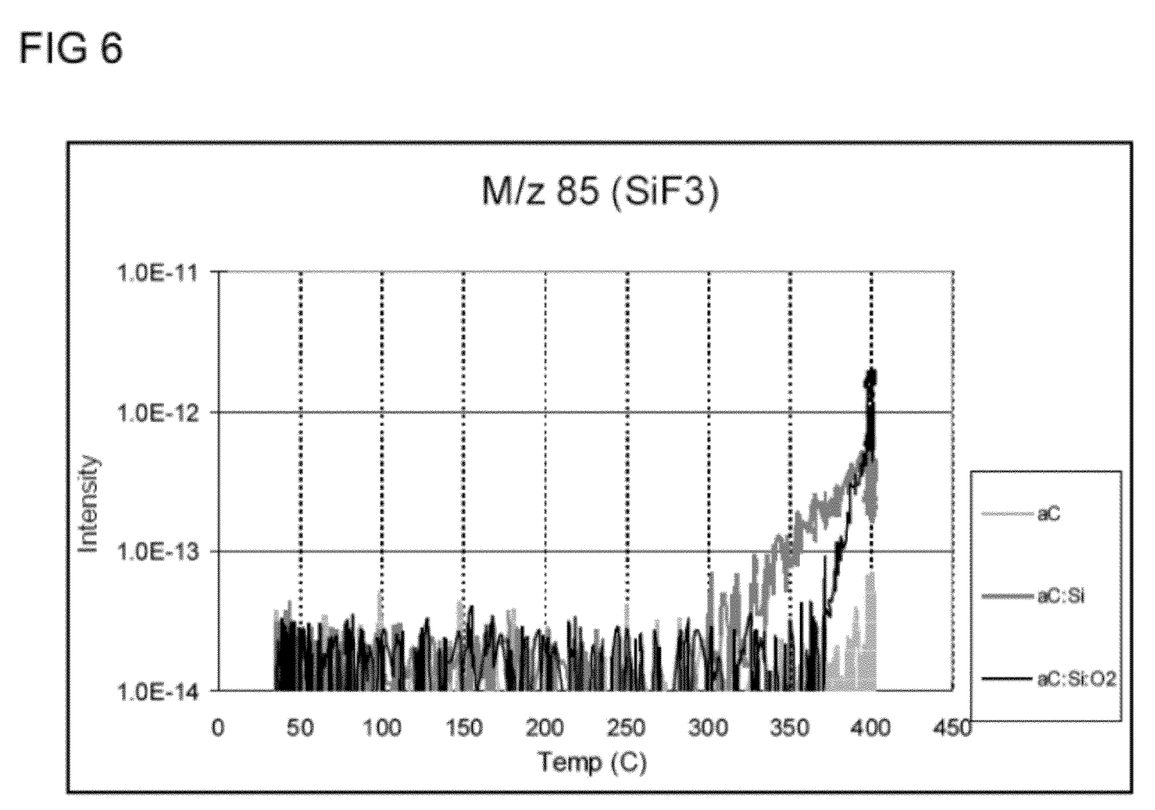
FIG. 6 illustrates a TDS analysis of $SiF_3$ gas desorption for various experimental samples with the same target structure shown in FIG. 4.

In the next experiment, the amount of silicon tri-fluoride ($SiF_3$) desorption gas with a molecular weight of 85 (M/z=85) is investigated. For this purpose, the thermal desorption spectroscopy of three experimental samples (aC, aC:Si, and aC:Si:$O_2$) are measured and the results are shown in FIG. 6. Similar to the results of previous experiment, shown in FIG. 5, the vertical axis is the measured-value intensity of $SiF_3$ gas at a mass of 85 (M/z=85) and the horizontal axis is the substrate temperature in which the TDS measurement are conducted (~25° C. to 400° C.). In this experiment, the amount of $SiF_3$ desorption gas with the mass of 85 is detected.

As shown in FIG. 6, the experimental sample #1, with conventional amorphous carbon (aC) layer, shows the smallest amount of silicon tri-fluoride ($SiF_3$) desorption gas. As described previously, the silicon doping of amorphous carbon layer suppresses the generation of HF gas, however at shown in FIG. 5, the $SiF_3$ reaction starts at the substrate temperature of 300° C. The results of this experiment shows that the addition of oxygen gas ($O_2$) into the film forming atmosphere may suppress the $SiF_3$ reaction up to a substrate temperature of about 370° C. Therefore, the new silicon-doped-oxygen amorphous carbon (aC:Si:O2) layer formed according to the process of the present invention, provides a better adhesion even at higher substrate temperatures (~400° C.) compared to the conventional silicon-doped amorphous carbon (aC:Si) layer.

Figure 7:
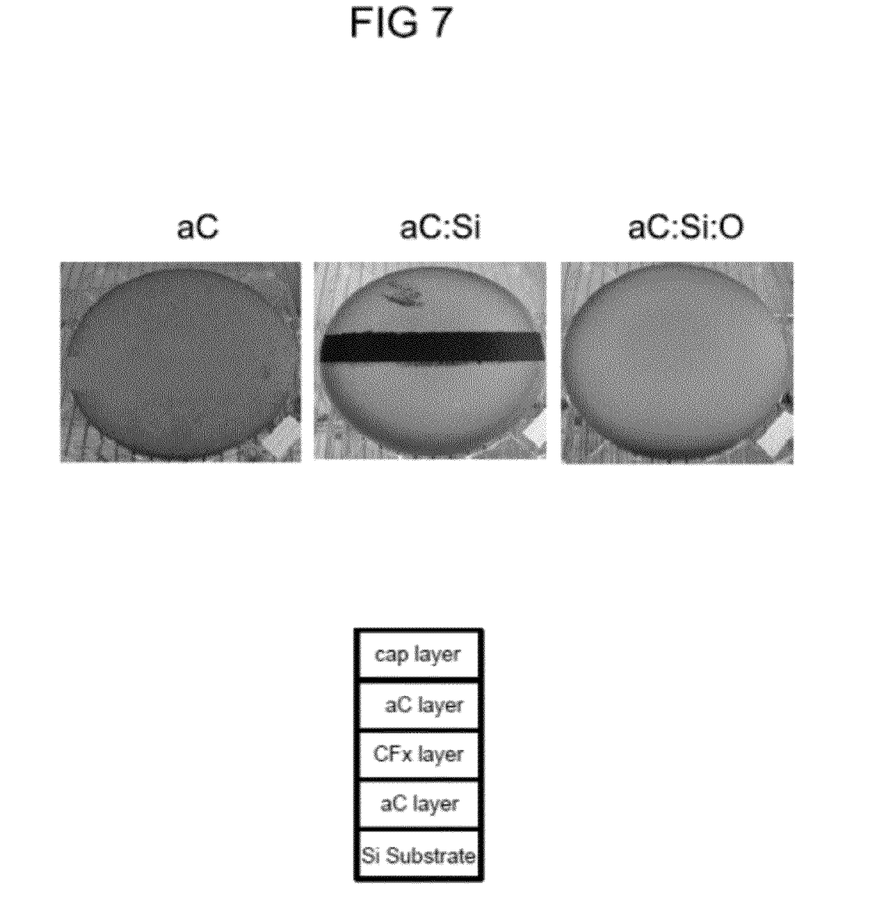
FIG. 7 illustrates target structure and surface views of various experimental samples with their blister and tape test results.

With reference to FIG. 7, a target structure and plan views of various experimental samples with their blister and tape test results are shown. The structure used for this evaluation includes a silicon substrate, a first amorphous carbon layer, a fluorocarbon layer, a second amorphous carbon layer, and a hermetic cap layer. The first amorphous carbon layer is formed on the silicon substrate while the second amorphous carbon layer is formed over the fluorocarbon (CFx) layer. Both amorphous carbon layers are formed using the plasma film forming device 10 with same setting conditions as described in paragraph [0038]. The hermetic cap layer, which has a high adhesivity relative to the amorphous carbon (aC) layer, is disposed over the amorphous carbon (aC) layer to react with desorption gas generation of underlying layers. Similar to previous experiment, three experimental samples with different amorphous carbon layers (aC, aC:Si, and aC:Si:$O_2$) are formed for this evaluation.

A pre-evaluation annealing is then performed at a temperature of about 350° C. for a period of 24 hours. The pre-evaluation annealing is performed in pure nitrogen ($N_2$) atmosphere having an oxygen ($O_2$) concentration of not more than 10 ppm. After performing the pre-evaluation annealing, the experimental samples are subjected to the tape test and the blister test. A plan view of each experimental sample after adhering scotch tape to their surface is also shown in FIG. 6.

As shown in this figure, the experimental samples #1 and #2 with the conventional and silicon-doped amorphous carbon (aC, aC:Si) layers show air bubbles or blisters on their surface, resulting in peeling-off of the amorphous carbon (aC, aC:Si) layers from the fluorocarbon (CFx) insulating layer. On the contrary, the experimental sample with the silicon-doped-oxygen amorphous carbon (aC:Si:O$_2$) layer shows no air bubbles or blisters on its surface and therefore no peeling-off of the layers has occurred even after performing the pre-evaluation annealing step.

Table I summarizes the value of leakage current (Jg@1.5 MV/cm) and the relative permittivity for each experimental sample. As shown in Table I, although, the oxygen doping of amorphous carbon layer (aC:Si:O$_2$) slightly increases the permittivity of the amorphous carbon (aC) layer, it improves the leakage current value of the amorphous carbon (aC) layer by about 2 digits.

| Experimental samples | Jg@ 1.5 MV/cm | Relative Permittivity (k) @1.5 MV/cm |
|---|---|---|
| aC | $9.5 \times 10^{-6}$ | 2.68 |
| aC:Si | $3.1 \times 10^{-6}$ | 2.81 |
| aC:Si:O$_2$ | $4.0 \times 10^{-8}$ | 3.05 |

While the principles of the disclosure have been described above in connection with specific apparatuses and methods, it is to be clearly understood that this description is made only by way of example and not as limitation on the scope of the invention.

What is claimed is:

1. A method of forming an amorphous carbon layer on an insulating layer, the method comprising the step of:
    forming an amorphous carbon layer using a plasma reaction process, wherein the amorphous carbon layer is formed in an atmosphere containing a plasma excitation gas, a C$_x$H$_y$ series gas, a silicon-containing gas, and an oxygen-containing gas.

2. The method as recited in claim 1, wherein a flow rate of oxygen-containing gas is ranging from 10 sccm to 100 sccm.

3. The method as recited in claim 1, wherein a flow rate of plasma excitation gas is ranging from 100 sccm to 2000 sccm and a flow rate of silicon-containing gas and C$_x$H$_y$ series gas are ranging from 10 sccm to 200 sccm.

4. The method as recited in claim 1, wherein the amorphous carbon layer is formed under a pressure ranging from 10 mTorr to 100 mTorr with a microwave power ranging from 1000 W to 3000 W.

5. The method as recited in claim 1, wherein the silicon-containing gas is introduced prior to introducing the oxygen-containing gas.

6. The method as recited in claim 5, wherein the C$_x$H$_y$ series gas is introduced after introducing the plasma excitation gas and prior to introducing the silicon-containing gas and the oxygen-containing gas.

7. The method as recited in claim 1, wherein a substrate temperature is maintained between about 150° C. and 400° C. during the forming step.

8. The method as recited in claim 1, wherein the amorphous carbon layer is formed using a radial line slot antenna (RLSA) microwave plasma processing device.

9. The method as recited in claim 1, wherein the amorphous carbon layer has a multilayer structure.

10. The method as recited in claim 9, wherein the multilayer structure comprises:
    a first layer comprising hydrocarbon compounds formed on the insulating layer,
    a second layer comprising hydrocarbon compounds doped with silicon and formed over the first layer, and
    a third layer comprising hydrocarbon compounds doped with silicon and oxygen and formed over the second layer.

11. A method for manufacturing a semiconductor device having an amorphous carbon layer as a barrier layer, the method comprising the steps of:
    forming a fluorocarbon (CFx) layer over a substrate;
    forming an amorphous carbon layer on the fluorocarbon (CFx) layer using a plasma reaction process, wherein the amorphous carbon layer is formed in an atmosphere containing a plasma excitation gas, a C$_x$H$_y$ series gas, a silicon-containing gas, and an oxygen-containing gas.

12. The method as recited in claim 11, wherein a flow rate of oxygen-containing gas is ranging from 10 sccm to 100 sccm.

13. The method as recited in claim 11, wherein a flow rate of plasma excitation gas is ranging from 100 sccm to 2000 sccm and a flow rate of silicon-containing gas and C$_x$H$_y$ series gas are ranging from 10 sccm to 200 sccm.

14. The method as recited in claim 11, wherein the amorphous carbon layer is formed under a pressure ranging from 10 mTorr to 100 mTorr with a microwave power ranging from 1000 W to 3000 W.

15. The method as recited in claim 11, wherein the silicon-containing gas is introduced prior to introducing the oxygen-containing gas.

16. The method as recited in claim 15, wherein the C$_x$H$_y$ series gas is introduced after introducing the plasma excitation gas and prior to introducing the silicon-containing gas and the oxygen-containing gas.

17. The method as recited in claim 11, wherein a substrate temperature is maintained between about 150° C. and 400° C. during the forming step.

18. The method as recited in claim 11, wherein the amorphous carbon layer is formed using a radial line slot antenna (RLSA) microwave plasma processing device.

19. The method as recited in claim 11, wherein the amorphous carbon layer has a multilayer structure.

20. The method as recited in claim 18, wherein the multilayer structure comprises:
    a first layer comprising hydrocarbon compounds formed on the insulating layer,
    a second layer comprising hydrocarbon compounds doped with silicon and formed over the first layer, and
    a third layer comprising hydrocarbon compounds doped with silicon and oxygen and formed over the second layer.

* * * * *